US006534968B1

(12) United States Patent
Miller et al.

(10) Patent No.: US 6,534,968 B1
(45) Date of Patent: Mar. 18, 2003

(54) INTEGRATED CIRCUIT TEST VEHICLE

(75) Inventors: Leah M. Miller, Fremont, CA (US);
Anand Govind, Fremont, CA (US);
Zafer Kutlu, Menlo Park, CA (US);
Chao-Wen Chung, Union City, CA (US); Aritharan Thurairajaratnam, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 64 days.

(21) Appl. No.: 09/928,071

(22) Filed: Aug. 10, 2001

(51) Int. Cl.$^7$ ................................................ G01R 31/00
(52) U.S. Cl. ..................... 324/158.1; 324/500; 324/537
(58) Field of Search ............................... 324/158.1, 500, 324/537, 755, 756, 754, 758; 702/58, 185; 323/284; 361/238; 365/261; 257/777, 776

(56) References Cited

U.S. PATENT DOCUMENTS 4,158,811 A * 6/1979 Li ............................... 324/210
5,386,623 A * 2/1995 Okamoto ....................... 29/832
6,249,136 B1 * 6/2002 Maley ........................... 324/765

* cited by examiner

Primary Examiner—Kamand Cuneo
Assistant Examiner—Trung Nguyen
(74) Attorney, Agent, or Firm—Luedeka, Neely & Graham

(57) ABSTRACT

An apparatus for detecting failures in electrical connections between an integrated circuit package substrate and a circuit board. The substrate has substrate electrical contacts that are electrically connected one to another in first sets in a first region of the substrate. The circuit board has circuit board electrical contacts that are electrically connected one to another in second sets in a second region of the circuit board. The substrate electrical contacts align with and make electrical contact with the circuit board electrical contacts. The first region of the substrate aligns with the second region of the circuit board when the substrate electrical contacts make electrical contact with the circuit board electrical contacts. The first sets of substrate electrical contacts form chains of electrical contacts with the second sets of circuit board electrical contacts. The chains of electrical contacts loop back and forth electrically between the substrate and the circuit board.

20 Claims, 4 Drawing Sheets

INTEGRATED CIRCUIT TEST VEHICLE

FIELD

This invention relates to the field of back end integrated circuit processing. More particularly, this invention relates to testing integrated circuit packaging and mounting.

BACKGROUND

A great amount of the energy used by integrated circuits is dissipated as heat. As integrated circuits have become faster and faster over time, they tend to draw a greater amount of current within a given amount of time, thus generating more heat that needs to be dissipated within that given amount of time. Further complicating this situation is the trend of ever decreasing size of the integrated circuits. Thus, as new generations of integrated circuits are designed and created, they tend to generate more heat at a faster rate and within a smaller area than prior designs.

If the heat generated by an integrated circuit is not adequately dissipated, then the integrated circuit may fail over time. The mode of failure of the integrated circuit can take many forms. For example, the active devices themselves, such as semiconducting devices, may become too hot and change in fundamental nature, thereby becoming inoperable. Another mode of failure is the mechanical stress on the various components caused by the heating and cooling of the integrated circuit as it is switched off and on.

For example, as the integrated circuit is operated, it tends to heat the packaging and other components in its vicinity. Conversely, when the integrated circuit is turned off, it tends to cool, thus allowing the packaging and other nearby components to also cool. As the package heats and cools, it tends to swell and shrink respectively. As the package changes size in this manner, the physical electrical connections between the integrated circuit and the package, known as level one connections, and the physical electrical connections between the package and the circuit board to which it is mounted, known as level two connections, are strained. The strain occurs as the integrated circuit, the package, and the circuit board tend to swell at different rates and to different degrees as they are heated. This situation tends to cause a shearing stress on both the level one connections and the level two connections. Over an extended period of time, the repetitive stress on these physical electrical connections may cause them to crack and fail.

Accelerated testing is used to cull integrated circuit designs in general and individual integrated circuits that are prone to this type of failure. During the accelerated testing, the integrated circuits are cycled off and on in a manner that is designed to exceed their typical cycle rate in actual use. Additionally, the ambient temperature of the test environment is preferably alternately heated and cooled to exaggerate the natural swelling and shrinking of the integrated circuit during cycling. In this manner, design flaws and flaws of individual integrated circuits, packages, circuit boards, and the physical electrical connections between them can be tested in an accelerated manner, thus culling the flawed devices and designs before they are released to the market.

Unfortunately, because of the increasing number of physical electrical connections that current integrated circuit designs require, it becomes very difficult to efficiently and effectively monitor electrical connections and determine when they fail. What is needed, therefore, is a system for effectively monitoring electrical connections during accelerated testing, and for also monitoring other packaging characteristics.

SUMMARY

The above and other needs are met by an apparatus for detecting failures in electrical connections between an integrated circuit package substrate and a circuit board. The substrate has substrate electrical contacts that are electrically connected one to another in first sets in a first region of the substrate. The circuit board has circuit board electrical contacts that are electrically connected one to another in second sets in a second region of the circuit board. The substrate electrical contacts align with and make electrical connection with the circuit board electrical contacts. The first region of the substrate aligns with the second region of the circuit board when the substrate electrical contacts make electrical connection with the circuit board electrical contacts. The first sets of substrate electrical contacts form chains of electrical contacts with the second sets of circuit board electrical contacts. The chains of electrical contacts loop back and forth electrically between the substrate and the circuit board.

With the apparatus as described above, many electrical connections between the substrate and the circuit board may be tested, such as for continuity, by making a relatively fewer number of connections from the circuit board to a tester. This is preferably accomplished by contacting one end of a chain with one tester contact and the other end of the chain with another tester contact. The chains loop back and forth multiple times through electrical connections between the substrate and the circuit board, because the contacts of the substrate are connected together in sets and the contacts of the circuit board are connected in sets. Thus, each of these second level connections through which the chain loops is tested by probing the single set of end contacts for the chain. Thus, a relatively large number of connections can be tested in an expedient manner.

In various preferred embodiments of the apparatus, the first region is an area underlying an integrated circuit that is mounted to the substrate. In an alternate embodiment the first region includes an additional area extending outward from the area underlying the integrated circuit for about twenty-five percent of a diameter of the integrated circuit. In a further alternate embodiment the first region includes an additional area extending outward from the area underlying the integrated circuit for about four millimeters.

Although the first sets of electrical contacts may contain more than two substrate electrical contacts, in the most preferred embodiment the first sets contain two substrate electrical contacts. Likewise, most preferably the second sets of circuit board electrical contacts are pairs of two circuit board electrical contacts. In this manner, the chains of electrical contacts loop back and forth between the substrate and the circuit board through all of the contacts within the first and second regions. Most preferably the chains of electrical contacts form annular ring patterns with open ends, where the open ends are offset from one chain of electrical contacts to adjacent chains of electrical contacts. The substrate electrical connections in the first region are preferably disconnected from electrical connections to an integrated circuit mounted on the substrate.

In a most preferred embodiment, an integrated circuit is mounted to the substrate and overlies the first region. The integrated circuit has integrated circuit electrical contacts electrically connected in third sets one to another. The integrated circuit electrical contacts make electrical connection with fourth sets of substrate electrical contacts. The third sets of integrated circuit electrical contacts form chains of electrical contacts with the fourth sets of substrate electrical contacts. The chains of electrical contacts loop back and forth electrically between the integrated circuit and the substrate. Thus, in this embodiment there is also provided a means for testing the first level connections.

In yet a further preferred embodiment, there is provided a test structure for testing impedance of lead lines on routing layers of the substrate. The test structure has two pairs of lead lines, with all of the lead lines disconnected from an integrated circuit. A first lead line from each of the two pairs of lead lines are electrically connected together on first ends underlying the integrated circuit. Second ends are electrically connected to vias in a peripheral portion of the substrate. The first lead line from each of the two pairs of lead lines thereby form a long, open looped lead line. A second lead line from each of the two pairs of lead lines have no electrical connections on first ends that underlie the integrated circuit, and are electrically connected to vias on second ends in the peripheral portion of the substrate. Contacts connected to the vias are electrically probed to test the impedance of the test structure.

In another aspect of the invention, a method for detecting failures in electrical connections between an integrated circuit package substrate and circuit board is provided.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The level two connections in the region of the substrate that underlies the integrated circuit, and extending outward in all directions from this region on the substrate for a given distance, perhaps about twenty-five percent of the width of the integrated circuit or so, is an area of particularly strong stresses and relatively high failure rates. Therefore, according to the present invention, this area is targeted for monitoring the condition of electrical connections, especially level two connections, or in other words the physical electrical connections between the package for the integrated circuit and the printed circuit board to which the package is mounted.

Figure 1:
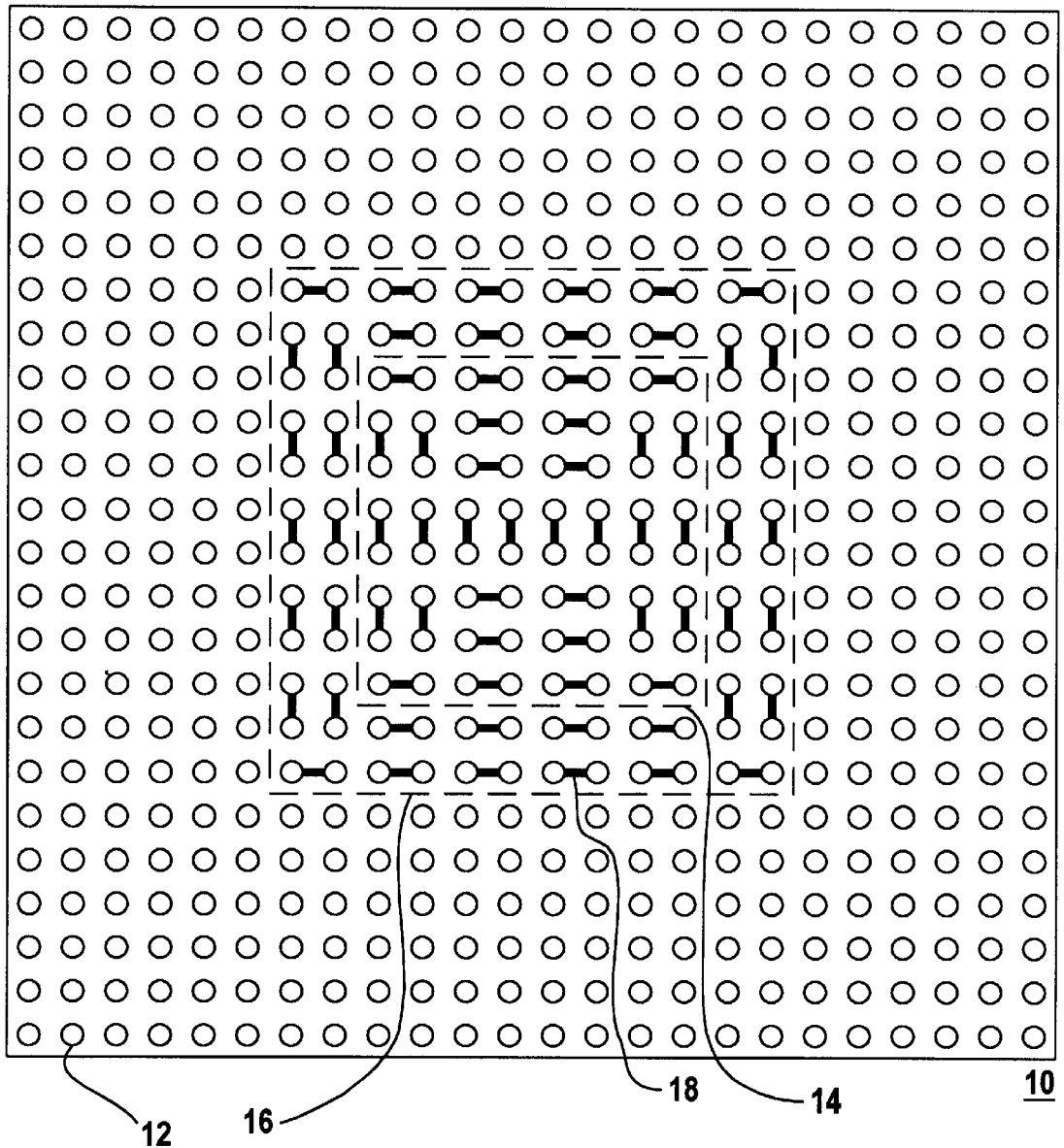
FIG. 1 is a top plan view of a portion of an integrated circuit package substrate, showing electrical connections.

Referring now to FIG. 1 there is depicted a top plan view of a portion of a substrate 10, such as used to receive an integrated circuit for packaging. It is appreciated that the substrate 10 as depicted in FIG. 1 is representational only. Thus, the number of substrate electrical contacts 12, the arrangement of the contacts 12, and relative sizes of the regions as depicted are for the purpose of description of the invention, and not by way of limitation. It is also appreciated that the view of FIG. 1 is not necessarily a top plan view, as described in more detail below. However, this view is given to simplify the description and understanding of the invention.

In a central portion of the substrate 10 there is disposed a region 14 that underlies an integrated circuit, which is not depicted. As mentioned above, the size of the region 14 is representational only, and not limiting to the scope of the invention. In an actual embodiment, the region 14 which underlies the integrated circuit would typically contain a far greater number of contacts 12. However, this reduced number of contacts 12 has been used so as to not unduly complicate the figures, to ease explanation of the embodiments of the invention, and to more fully focus attention onto the relatively more important aspects of the invention.

The integrated circuit is preferably mounted on the side of the substrate 10 that is opposite of the side depicted. The substrate 10 is preferably of a fairly thin laminate material. Therefore, in a preferred embodiment, a stiffener ring is mounted on the substrate 10, most preferably on the same side of the substrate 10 to which the integrated circuit is mounted. The outside border of the substrate 10 as depicted in FIG. 1 generally indicates the inside edge of the stiffener ring. Thus, the substrate 10 as depicted in FIG. 1 is a view of just the inner-most portion of the substrate 10.

As mentioned above, for a variety of reasons, including the flexibility of the substrate 10 and the heat source of the integrated circuit, the region 14 underlying the integrated circuit tends to be an area where the level two connections between the substrate 10 and the circuit board to which it is electrically connected tend to be rigorously stressed. Further, there is an additional region, representationally bounded on the outside by border 16, which is also a region of high stress on the level two connections. These two regions together form a first region 16 of relative high stress. It is appreciated that the size of these regions, included in the first region 16, is representational in proportion to the area of the substrate 10 as depicted in FIG. 1.

The size of the region 14 underlying the integrated circuit is, of course, primarily dependant upon the size of the integrated circuit that is mounted to the substrate 10. Thus, the size of the region 14 will shrink or grow according to the size of the integrated circuit that is mounted to the substrate 10. Similarly, the size of the additional border region that constitutes the first region 16 with the region 14 is also dependent upon a variety of factors, and is not limited to any specific set additional size. These factors may include, but are not limited to, the flexibility of the substrate 10, the heat conductivity of the substrate 10, the size of the integrated circuit, the amount of heat produced by the integrated circuit, the various materials from which the different components are constructed, and the proximity of the stiffener ring.

In general, the additional border region is on the order of a few millimeters, which may be in the neighborhood of about twenty-five percent or so of the diameter of the integrated circuit, or in other words, the region 14 that underlies the integrated circuit. Thus, as depicted in FIG. 1, the region 14 underlying the integrated circuit has a certain width, which as measured by the spacing of the electrical contacts 12 is about eight "units" in width. Thus, the first region 16 is wider in all directions than the region 14 by an additional two "units." In a most preferred embodiment, this additional width is about four millimeters in all directions.

As depicted in FIG. 1, some of the contacts 12 within the first region 16 are electrically connected, one to the other, with electrical leads 18. Thus, the contacts 12 within the first region 16 are electrically connected in first sets. In the example as depicted in FIG. 1, the sets are of pairs of contacts 12. Although this is the most preferred embodiment for the first sets, in alternate embodiments the first sets could consist of three or more contacts 12. However, in the preferred embodiment where the first sets are of pairs of contacts 12, the greatest benefits of the invention are realized, as described in more detail below.

In a most preferred embodiment, the contacts 12 within the first region 16 are not electrically connected to the integrated circuit. Thus, the substrate 10, which comprises a portion of the test vehicle for the integrity of the level one connections, and more specifically the level two connections, is preferably not used for production packaging, but instead is preferably used only for test purposes. It is appreciated that the integrated circuit preferably makes electrical connection with other contacts 12 on the substrate 10, such as those disposed outside of the first region 16, and within the inner boundary of the stiffener ring, as depicted in FIG. 1. Thus, the substrate 10 preferably provides the ability to test the first level electrical connections as well, as described in more detail below.

Figure 2:
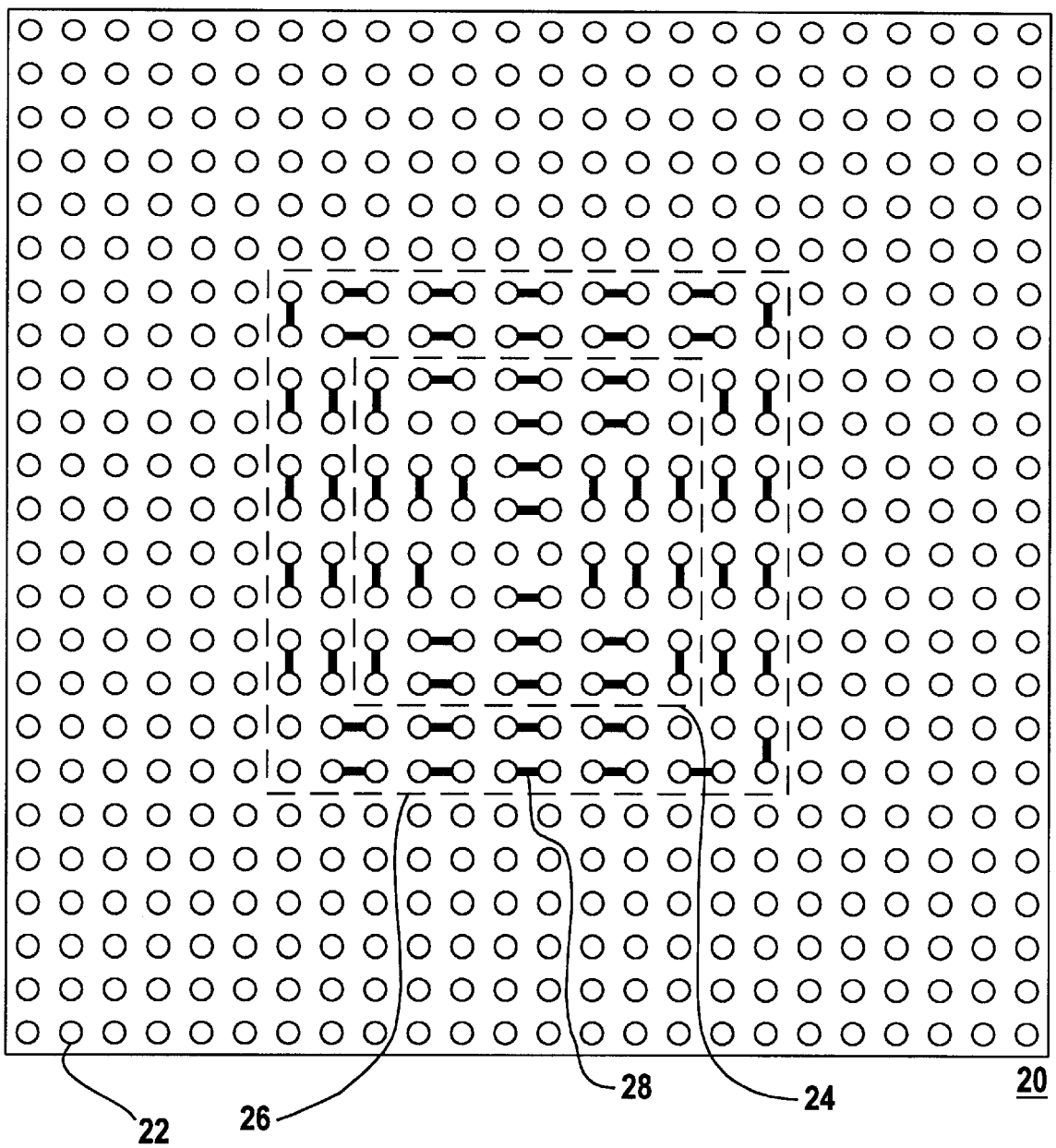
FIG. 2 is a top plan view of a portion of a printed circuit board, showing electrical connection.

Referring now to FIG. 2, there is depicted a top plan view of a portion of a circuit board 20 that receives the portion of the substrate 10 depicted in FIG. 1. As depicted, the circuit board 20 also has electrical contacts 22, which contacts 22 are designed to receive and make electrical connection with the contacts 12 of the substrate 10. Also depicted is a region 24, indicating the region that underlies the integrated circuit when the integrated circuit is mounted to the substrate 10 and the substrate 10 is mounted to the circuit board 20. Further, there is depicted a second region 26, which is a region of the circuit board 20 that corresponds to the first region 16 of the substrate 10. Thus, the second region 26 is the other part of the second level connections that tend to be highly stressed, and for which it is desired to rigorously test for failures.

Similar to those as described above for the substrate 10, there are also certain second sets of contacts 22 on the circuit board 20 that are electrically connected, one to the other by electrical connections 28. In the example as depicted in FIG. 2, the sets are of pairs of contacts 22. Although this is the most preferred embodiment for the second sets, in alternate embodiments the second sets could be of three or more contacts 22. However, in the preferred embodiment where the second sets are of pairs of contacts 22, the greatest benefits of the invention are realized, as described in more detail below. It is further appreciated that the number of contacts 12 or 22 in a given first set or second set of contacts may be different from set to set, and that the number of contacts 12 in a first set need not be the same as the number of contacts 22 in a second set. It is also appreciated that the view of FIG. 2 is not necessarily a top plan view, as described in more detail below. However, this view is given to simplify the description and understanding of the invention.

Figure 3:
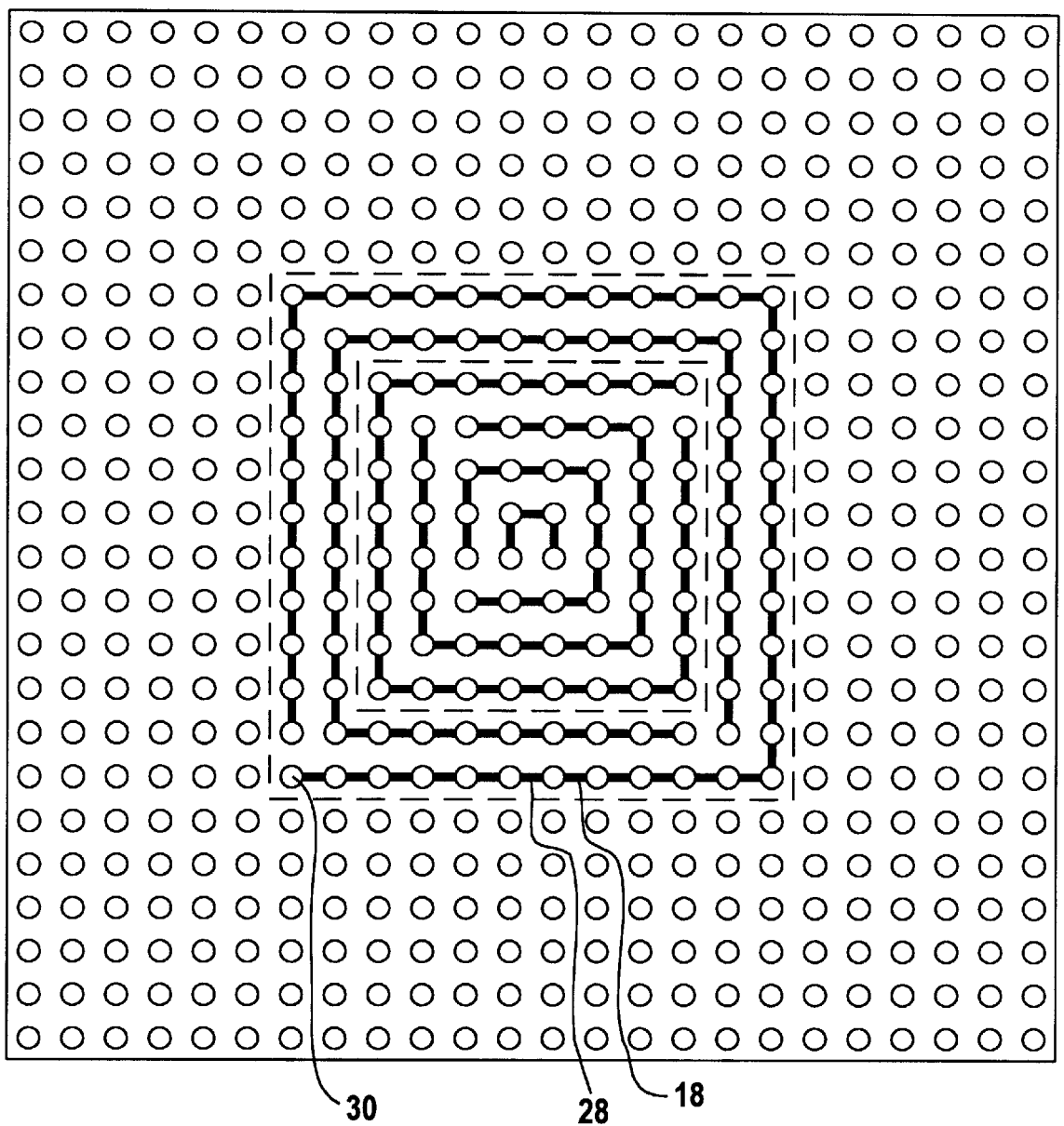
FIG. 3 is a top plan overlaid view of the electrical connections of the integrated circuit package substrate and the printed circuit board.

Referring now to FIG. 3, there is depicted an overlaid representation of the portion of the substrate 10 as it is received by the circuit board 20. As depicted, the electrical connections 28 between the contacts 22 of the circuit board 20 and the electrical connections 18 between the contacts 12 of the substrate 10 create chains of electrical contacts that loop back and fourth between the substrate 10 and the circuit board 20. As depicted in FIG. 3, these chains of contacts form long, open ended annular rings. However, this is only representational of the types of chains that can be formed, and is not by way of limitation.

The chains are preferably open on the ends 30, so that electrical connections can be made between the chains and a tester. In this manner, the tester can check the electrical properties of the chains, such as electrical continuity, to determine how well the electrical connections are bearing up during the test conditions, such as accelerated and amplified heat cycling. In a most preferred embodiment, the open ends 30 of the various chains of contacts are offset from one chain to the adjacent chains, so that routing out of the electrical connections to the tester is more easily accomplished.

It is appreciated that, the substrate 10 as depicted in FIG. 1 and the circuit board 20 as depicted in FIG. 2, if both are depicted from the mating side, would not unite in the manner as depicted in FIG. 3, because by flipping one or the other of the substrate 10 and the circuit board 20 over to contact the other would place the electrical connections 18 or 28 in mirror image positions from those as shown in FIG. 3. Thus, the figures have been drawn in a manner to more easily convey the intent of the invention, which is that of building chains of electrically connected contacts 12 and 22 with the electrically connected first sets and second sets, rather than to literally depict the exact placements of the electrical connections 18 and 28. Thus, in effect, one or the other of FIG. 1 and FIG. 2 is actually the arrangement of the electrical connections 18 or 28 as viewed through the substrate 10 or circuit board 20 respectively, rather than a top plan view of the substrate 10 or circuit board 20.

Figure 4:
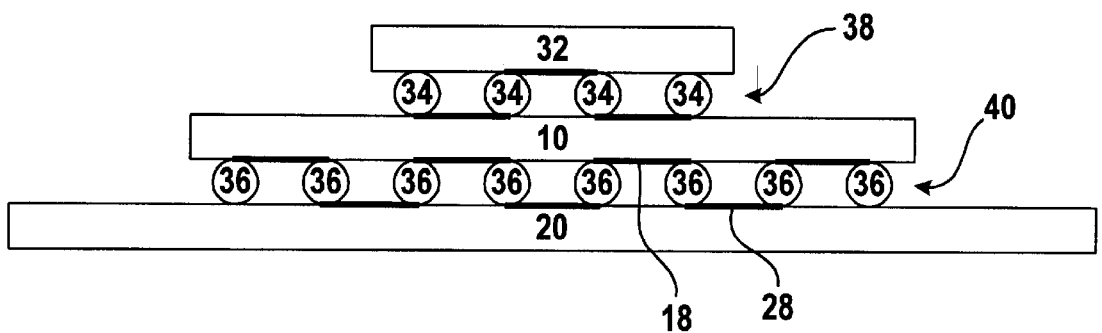
FIG. 4 is a cross section view of the electrical connections between an integrated circuit and an integrated circuit package substrate and between an integrated circuit package substrate and a printed circuit board.

Referring now to FIG. 4, there is a cross sectional view of an integrated circuit 32 mounted to a substrate 10, where the substrate 10 is also mounted to a circuit board 20. Thus, the physical embodiments of the regions 14 and 24 (not explicitly depicted in FIG. 4) that underlie the integrated circuit 32 are more readily understood. Also depicted are the first level connections 38 between the integrated circuit 32 and the substrate 10, represented by solder bumps 34, and the second level connections 40 between the substrate 10 and the circuit board 20, represented by solder balls 36. Thus, the connections 34 and 36 are those which tend to be stressed through heat cycling and other forces, and which are to be tested with the vehicle of the present invention.

Further depicted in FIG. 4, in representational form, are the electrical connections 28 of the circuit board 20 and the electrical connections 18 of the substrate 10. In cross sectional view, the manner in which the chain of contacts loops back and fourth between the substrate 10 and the circuit board 20 is more easily seen and understood. As briefly mentioned above, by limiting the first sets of contacts 12 and the second sets of contacts 22 to pairs of two contacts each, the chain of contacts that is formed loops back and forth between the substrate 10 and the circuit board 20 through every one of the second level contacts 36. Thus, a failure, such as a continuity failure, in any one of the second level contacts 36 can be readily detected by electrically probing just the two ends 30 of the chain of contacts with a tester, such as through the circuit board 20.

It is appreciated that the present invention can also be applied to testing the first level electrical connections 34, by providing third sets of electrically connected contacts on the integrated circuit 32 which align with fourth sets of electrical contacts on the substrate 10, as depicted in FIG. 4, and similar to that as described above for the chains of contacts between the substrate 10 and the circuit board 20. It is further appreciated that the concepts of the invention as expressed above are not necessarily limited to flip chip type level one connections 38 and level two connections 40, but may also be applied to other electrical connections, such as wire bonded electrical connections.

Figure 5:
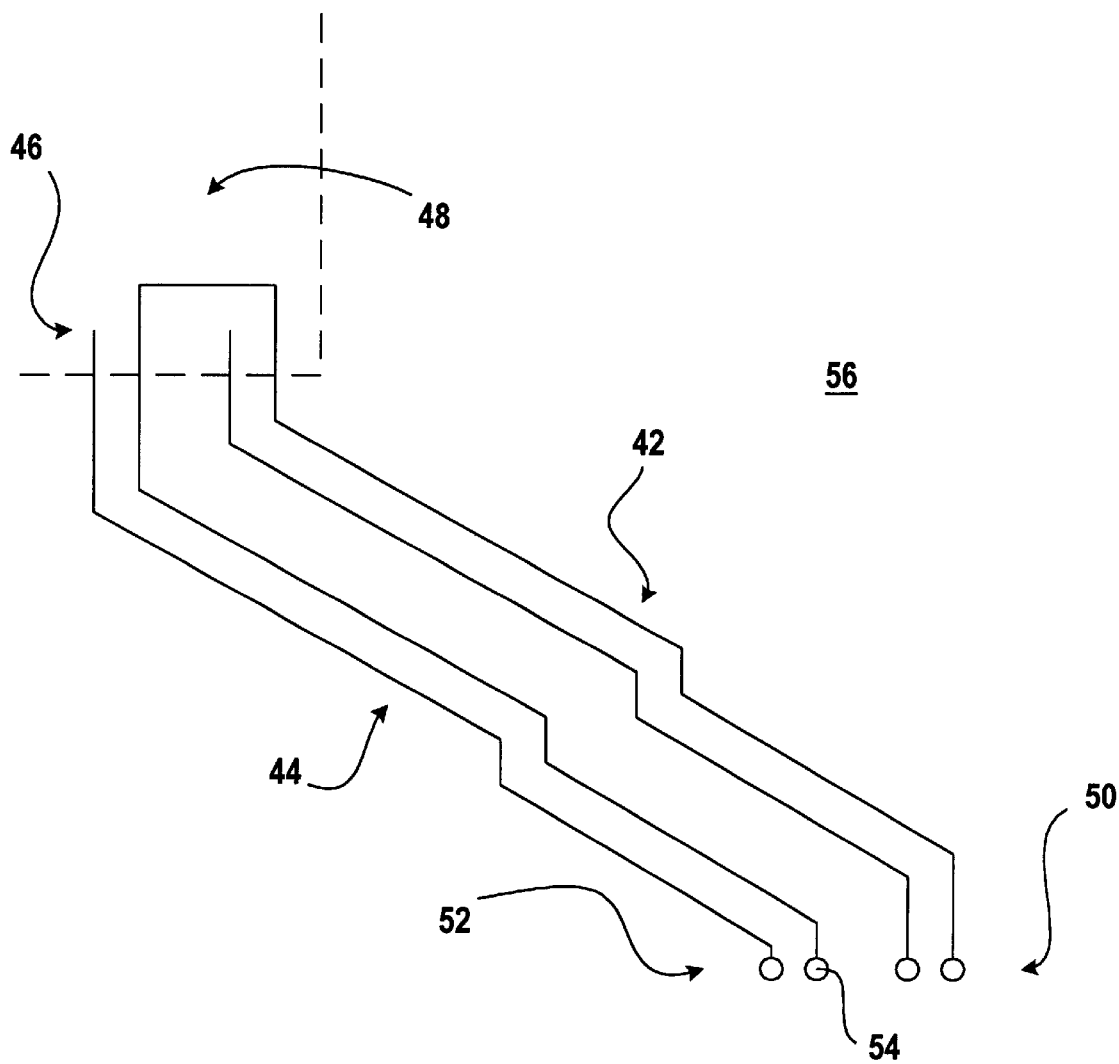
FIG. 5 is a top plan view of a structure for testing lead line impedance.

Referring now to FIG. 5, there is depicted a test structure 56 for cooperatively testing lead lines, such as lead lines of the substrate 10, for electrical characteristics such as impedance. The test structure 56 is comprised of a first set of lead lines 42 and a second set of lead lines 44 that have been modified according to the present invention. The test structure 56 preferably is placed on each routing layer of the substrate 10, and is most preferably disposed near a corner of the routing structure of the substrate 10. Most preferably, the lead lines 42 and 44 are not electrically connected to any of the contacts of the integrated circuit 32. Lead lines may be chosen to be representative of the electrical parameter that is being studied.

Preferably, a first lead line from each of the two sets of lead lines 42 and 44 are electrically connected at their first ends 46 in a central portion 48 of the substrate 10, such as a portion 48 that underlies the integrated circuit 32. The second ends 50 of the first lead lines from each of the two sets of lead lines 42 and 44 are preferably electrically connected to vias 54 at a peripheral portion 52 of the substrate 10, from which electrical connections to a tester can be made. A second lead line from each of the two sets of lead lines 42 and 44 are preferably not electrically connected to anything at their first ends 46 in the central portion 48 of the substrate 10. Preferably, the second lead lines from each of the two sets of lead lines 42 and 44 are similarly connected at their second ends 50 to vias 54 at the peripheral portion 52 of the substrate 10, from which electrical connections to the tester can be made.

With the test structure 56 as described above, electrical connections to the vias 54 can be probed with a tester, and various electrical characteristics of the lead lines, such as impedance between the lead lines, can be determined. The accuracy and sensitivity of these tests tends to be enhanced because of the long length of the first leads that are electrically connected one to the other at their first ends 46 in the central portion 48 of the substrate 10.

The foregoing description of preferred embodiments for this invention has been presented for purposes of illustration and description. The embodiments are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An apparatus for detecting failures in electrical connections between an integrated circuit package substrate and a circuit board, comprising:
   the substrate having substrate electrical contacts, the substrate electrical contacts electrically connected one to another in first sets in a first region of the substrate,
   the circuit board having circuit board electrical contacts, the circuit board electrical contacts electrically connected one to another in second sets in a second region of the circuit board,
   the substrate electrical contacts for aligning with and making electrical connection with the circuit board electrical contacts,
   the first region of the substrate aligning with the second region of the circuit board when the substrate electrical contacts make electrical connection with the circuit board electrical contacts, and
   the first sets of substrate electrical contacts forming chains of electrical contacts with the second sets of circuit board electrical contacts, where the chains of electrical contacts loop back and forth electrically between the substrate and the circuit board.

2. The apparatus of claim 1, wherein the first region comprises an area underlying an integrated circuit.

3. The apparatus of claim 1, wherein the first region comprises an area underlying an integrated circuit plus an additional area extending outward from the area underlying the integrated circuit for about twenty-five percent of a diameter of the integrated circuit.

4. The apparatus of claim 1, wherein the first region comprises an area underlying an integrated circuit plus an additional area extending outward from the area underlying the integrated circuit for about four millimeters.

5. The apparatus of claim 1, wherein the first sets of substrate electrical contacts comprise pairs of two substrate electrical contacts.

6. The apparatus of claim 1, wherein the first sets of substrate electrical contacts comprise sets of more than two substrate electrical contacts.

7. The apparatus of claim 1, wherein the second sets of circuit board electrical contacts comprise pairs of two circuit board electrical contacts.

8. The apparatus of claim 1, wherein the second sets of circuit board electrical contacts comprise sets of more than two circuit board electrical contacts.

9. The apparatus of claim 1, wherein the chains of electrical contacts form a ring pattern.

10. The apparatus of claim 1, wherein the chains of electrical contacts form annular ring patterns.

11. The apparatus of claim 1, wherein the chains of electrical contacts form annular ring patterns with open ends, where the open ends are offset from one chain of electrical contacts to adjacent chains of electrical contacts.

12. The apparatus of claim 1, wherein all of the substrate electrical connections in the first region are disconnected from electrical connections to an integrated circuit mounted on the substrate.

13. The apparatus of claim 1, further comprising:
   an integrated circuit mounted to the substrate and overlying the first region,
   the integrated circuit having integrated circuit electrical contacts electrically connected in third sets one to another,
   the integrated circuit electrical contacts for making electrical contact with fourth sets of substrate electrical contacts, and
   the third sets of integrated circuit electrical contacts forming chains of electrical contacts with the fourth sets of substrate electrical contacts, where the chains of electrical contacts loop back and forth electrically between the integrated circuit and the substrate.

14. The apparatus of claim 1, further comprising a stiffener ring mounted to the substrate, the stiffener ring having an interior edge, where the first region of the substrate is bounded within the interior edge of the stiffener ring.

15. The apparatus of claim 1, further comprising a test structure for testing impedance of lead lines on routing layers of the substrate, the test structure having:
   two pairs of lead lines, with all of the lead lines disconnected from an integrated circuit, a first lead line from each of the two pairs of lead lines electrically connected together on first ends underlying the integrated circuit, and electrically connected to vias on second ends in a peripheral portion of the substrate, the first lead lines from each of the two pairs of lead lines thereby forming a long, open looped lead line, and a second lead line from each of the two pairs of lead lines having no electrical connections on first ends underlying the integrated circuit, and electrically connected to vias on second ends in the peripheral portion of the substrate.

16. An apparatus for detecting failures in electrical connections between an integrated circuit package substrate and a circuit board, comprising:

the substrate having substrate electrical contacts, the substrate electrical contacts electrically connected in first sets of two substrate electrical contacts in a first region of the substrate underlying an area underneath an integrated circuit plus an additional area extending outward from the integrated circuit for about twenty-five percent of a diameter of the integrated circuit, the substrate electrical connections in the first region disconnected from electrical connections to the integrated circuit, the circuit board having circuit board electrical contacts, the circuit board electrical contacts electrically connected in second sets of two circuit board electrical contacts in a second region of the circuit board, the substrate electrical contacts for aligning with and making electrical contact with the circuit board electrical contacts, the first region of the substrate aligning with the second region of the circuit board when the substrate electrical contacts make electrical contact with the circuit board electrical contacts, and the first sets of substrate electrical contacts forming chains of electrical contacts with the second sets of circuit board electrical contacts, where the chains of electrical contacts loop back and forth electrically between the substrate and the circuit board, the chains of electrical contacts forming annular ring patterns with open ends, where the open ends are offset from one chain of electrical contacts to adjacent chains of electrical contacts.

17. The apparatus of claim 16, further comprising:

the integrated circuit having integrated circuit electrical contacts electrically connected in third sets one to another, the integrated circuit electrical contacts for making electrical contact with fourth sets of substrate electrical contacts, and the third sets of integrated circuit electrical contacts forming chains of electrical contacts with the fourth sets of substrate electrical contacts, where the chains of electrical contacts loop back and forth electrically between the integrated circuit and the substrate.

18. A method for detecting failures in electrical connections between an integrated circuit package substrate and a circuit board, the method comprising the steps of:

electrically connecting substrate electrical contacts one to another in first sets in a first region of the substrate, electrically connecting circuit board electrical contacts one to another in second sets in a second region of the circuit board, aligning and electrically connecting the first sets of substrate electrical contacts with the second sets of circuit board electrical contacts, the first sets of substrate electrical contacts thereby forming chains of electrical contacts with the second sets of circuit board electrical contacts, where the chains of electrical contacts loop back and forth electrically between the substrate and the circuit board, and probing ends of the chains of electrical contacts to detect failures in the chains of electrical contacts.

19. The method of claim 18, further comprising the step of alternately heating and cooling at least the substrate concurrently with the step of probing the ends of the chains of electrical contacts.

20. The method of claim 18, further comprising the step of testing impedance of lead lines on routing layers of the substrate, by:

forming two pairs of lead lines on each substrate layer, electrically connecting together a first lead line from each of the two pairs of lead lines on first ends in a central portion of the substrate, electrically connecting second ends to vias in a peripheral portion of the substrate, the first lead lines from each of the two pairs of lead lines thereby forming a long, open looped lead line, forming no electrical connections on first ends of a second lead line from each of the two pairs of lead lines in the central portion of the substrate, electrically connecting second ends to vias in the peripheral portion of the substrate, and electrically probing contacts connected to the vias.

* * * * *